United States Patent
Englert et al.

(10) Patent No.: US 8,681,479 B2
(45) Date of Patent: Mar. 25, 2014

(54) VARIOUS METHODS AND APPARATUSES FOR AN INTEGRATED POWER DISTRIBUTION PLATFORM

(75) Inventors: Matthew John Englert, San Jose, CA (US); Jeffrey David Rose, San Jose, CA (US); John Manual Loera, San Jose, CA (US)

(73) Assignee: Rosendin Electric, Inc., San Jose, CA (US)

( * ) Notice: Subject to any disclaimer, the term of this patent is extended or adjusted under 35 U.S.C. 154(b) by 595 days.

(21) Appl. No.: 12/549,963

(22) Filed: Aug. 28, 2009

(65) Prior Publication Data

US 2010/0302744 A1 Dec. 2, 2010

Related U.S. Application Data

(60) Provisional application No. 61/182,524, filed on May 29, 2009.

(51) Int. Cl.
   *H02B 1/00* (2006.01)
(52) U.S. Cl.
   USPC ............ 361/600; 174/50; 174/60; 361/601; 361/813; 361/730; 361/724; 52/220.2
(58) Field of Classification Search
   USPC .................. 361/813, 730, 724; 52/220.2
   See application file for complete search history.

(56) References Cited

U.S. PATENT DOCUMENTS

| | | | | |
|---|---|---|---|---|
| 3,066,898 A | * | 12/1962 | Haynes | 248/656 |
| 3,924,370 A | * | 12/1975 | Cauceglia et al. | 52/126.6 |
| 4,210,772 A | | 7/1980 | Magana et al. | |
| 4,214,799 A | | 7/1980 | Biche | |
| 4,878,653 A | | 11/1989 | Brown | |
| 4,918,258 A | | 4/1990 | Ayer | |
| 5,079,890 A | * | 1/1992 | Kubik et al. | 52/649.1 |
| 5,467,609 A | * | 11/1995 | Feeney | 62/259.2 |
| 5,477,649 A | * | 12/1995 | Bessert | 52/263 |

(Continued)

FOREIGN PATENT DOCUMENTS

| | | |
|---|---|---|
| AU | 2010253865 | 12/2011 |
| CA | 2763033 | 12/2010 |
| SG | 176227 | 12/2011 |
| WO | WO 2010/138771 A1 | 12/2010 |

OTHER PUBLICATIONS

International Search Report and Written Opinion, Application No. PCT/US2010/036485 mailed Jul. 27, 2010, 8 pages.
Sun Modular Datacenter, Jan. 2008, 4 pages.

(Continued)

*Primary Examiner* — Tuan T Dinh
*Assistant Examiner* — Steven Sawyer
(74) *Attorney, Agent, or Firm* — Rutan & Tucker, LLP

(57) ABSTRACT

A method, apparatus, and system are described for a pre-wired and pre-engineered integrated platform for power supply and distribution that is pre-assembled, scalable, and modular. The skeletal framework of the integrated platform acts as an equipment support structure as well as a cable routing support system. A set of cables having wiring is routed along the skeletal framework of the integrated platform and goes to two or more cabinet enclosures mounted onto the skeletal framework. The skeletal framework acts as a National Electric Code approved raceway system to support and route the set of cables to the electrical equipment in the mounted cabinet enclosures. The integrated platform supports the weight of the one or more cabinet enclosures mounted onto the skeletal framework.

20 Claims, 8 Drawing Sheets

(56) References Cited

U.S. PATENT DOCUMENTS

| | | | |
|---|---|---|---|
| 5,778,606 A | 7/1998 | Davis, Jr. et al. | |
| 6,019,322 A * | 2/2000 | Shimizu | 248/49 |
| 6,201,187 B1 | 3/2001 | Burbine | |
| 6,480,748 B1 | 11/2002 | Gerszberg et al. | |
| 6,542,500 B1 | 4/2003 | Gerszberg et al. | |
| 6,570,974 B1 | 5/2003 | Gerszberg et al. | |
| 6,657,320 B1 * | 12/2003 | Andrews et al. | 307/64 |
| 6,967,283 B2 | 11/2005 | Rasmussen et al. | |
| 7,278,273 B1 | 10/2007 | Whitted et al. | |
| 7,511,959 B2 | 3/2009 | Belady et al. | |
| 2003/0196402 A1 * | 10/2003 | Roen | 52/507 |
| 2004/0231875 A1 * | 11/2004 | Rasmussen et al. | 174/50 |
| 2005/0068716 A1 * | 3/2005 | Pereira | 361/624 |
| 2005/0078422 A1 * | 4/2005 | Pincu et al. | 361/62 |
| 2006/0087122 A1 | 4/2006 | Sheffield | |
| 2008/0030078 A1 * | 2/2008 | Whitted et al. | 307/66 |
| 2008/0053698 A1 | 3/2008 | Purves et al. | |
| 2008/0060790 A1 | 3/2008 | Yates et al. | |
| 2009/0058098 A1 | 3/2009 | Flynn | |

OTHER PUBLICATIONS

International Preliminary Report on Patentability for International Application No. PCT/US10/36485, dated Nov. 29, 2011, 7 pages.

First Office Action for Mexican Patent Application No. MX/a/2011/012656, dated Oct. 8, 2012, 3 pages.

Office Action for Mexican Patent Application No. MX/a/2011/012656 mailed Jun. 3, 2013, English translation, 2 pages. Instituto Mexicano de la Propiedad Industrial, México, D. F.

* cited by examiner

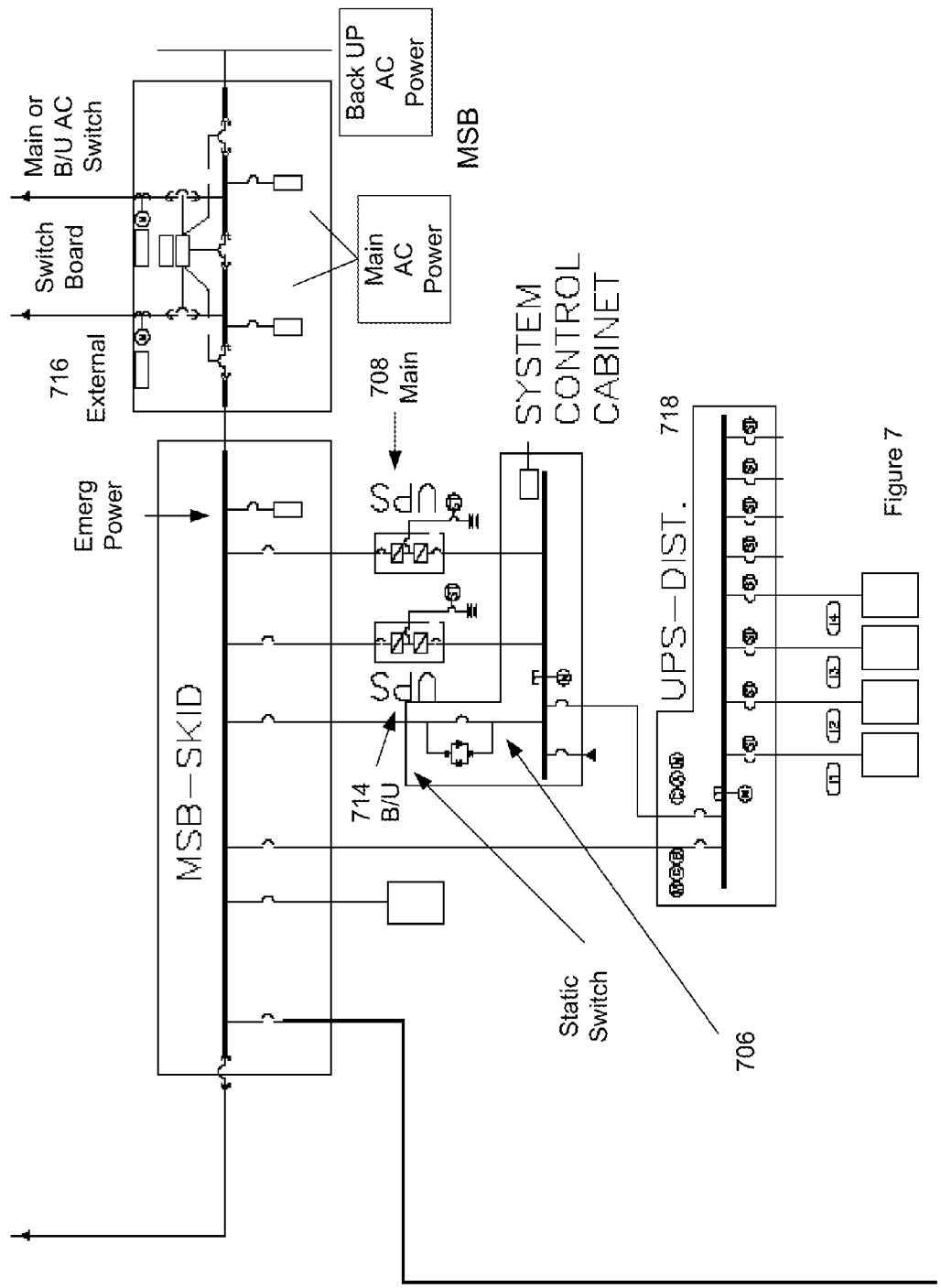

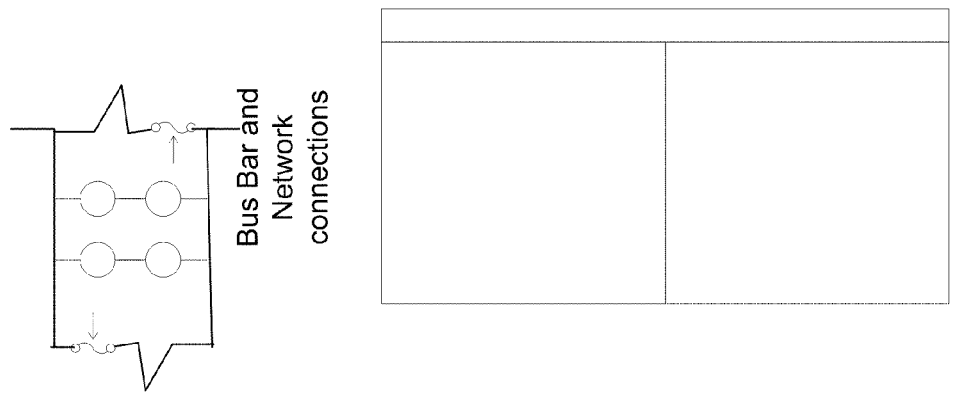
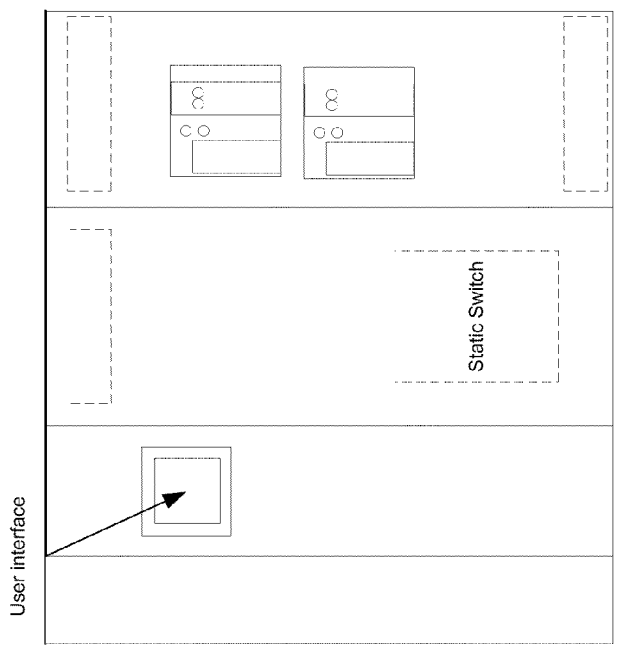
Front View
Figure 8a
Side View
Figure 8b

US 8,681,479 B2

VARIOUS METHODS AND APPARATUSES FOR AN INTEGRATED POWER DISTRIBUTION PLATFORM

RELATED APPLICATIONS

This application is a continuation in part of and claims the benefit of US provisional patent application titled "VARIOUS METHODS AND APPARATUSES FOR AN INTEGRATED POWER DISTRIBUTION PLATFORM," filed on May 29, 2009, with a Ser. No. 61/182,524.

FIELD OF THE INVENTION

Embodiments of the invention generally relate to a pre-wired and pre-engineered integrated platform for power supply and distribution that is pre-assembled, scalable, and modular.

BACKGROUND OF THE INVENTION

Construction projects proceed in stages because certain aspects of the project must be completed prior to the next stage being initiated. However, the traditional stages of constructing a building can be altered with some creative thinking.

SUMMARY OF THE INVENTION

A pre-wired and pre-engineered integrated platform for a set of two or more uninterruptable power supplies and power distribution that is pre-assembled, scalable, and modular is described. A set of cables having wiring is routed along a skeletal framework of the integrated platform. Equipment is supported on the skeletal framework of the integrated platform. Two or more cabinet enclosures are mounted onto the skeletal framework. The skeletal framework acts as a National Electric Code approved raceway system to support and route the set of cables to electrical equipment in the mounted cabinet enclosures. The weight of one or more cabinet enclosures mounted onto the skeletal framework is supported by the skeletal framework. A main power supply is housed in a first cabinet enclosure mounted to the skeletal framework. A backup power supply is housed in a second cabinet enclosure mounted to the skeletal framework. A power distribution center is housed in a third cabinet enclosure mounted to the skeletal framework. The main and redundant power supply wiring is laid out and routed along the skeletal framework of the integrated platform to and between the one or more enclosures mounted onto the skeletal framework.

The skeletal framework of the integrated platform has top and bottom rails run substantially parallel to each other with cross bars connecting the top and bottom rails to form the skeletal framework of the integrated platform. The skeletal framework has a top horizontal surface to which one or more of the cabinet enclosures mount to those rails making up the top horizontal surface of the skeletal framework. The wiring is routed along the frame in a vertical space between the bottom horizontal surface of the skeletal frame and the top horizontal surface of the skeletal frame. The set of cables, the skeletal framework, and the cabinet enclosures are fabricated in place prior to the integrated platform being installed, and are installed as a monolithic pre-wired pre-assembled integrated platform.

BRIEF DESCRIPTION OF THE DRAWINGS

The drawings refer to embodiments of the invention in which:

FIG. 7 illustrates a one line electrical schematic of an embodiment of the pre-wired and pre-engineered integrated platform for a modular power supply and distribution system.

FIGS. 8a and 8b illustrate an embodiment of the System Control Cabinet.

Figure 1:
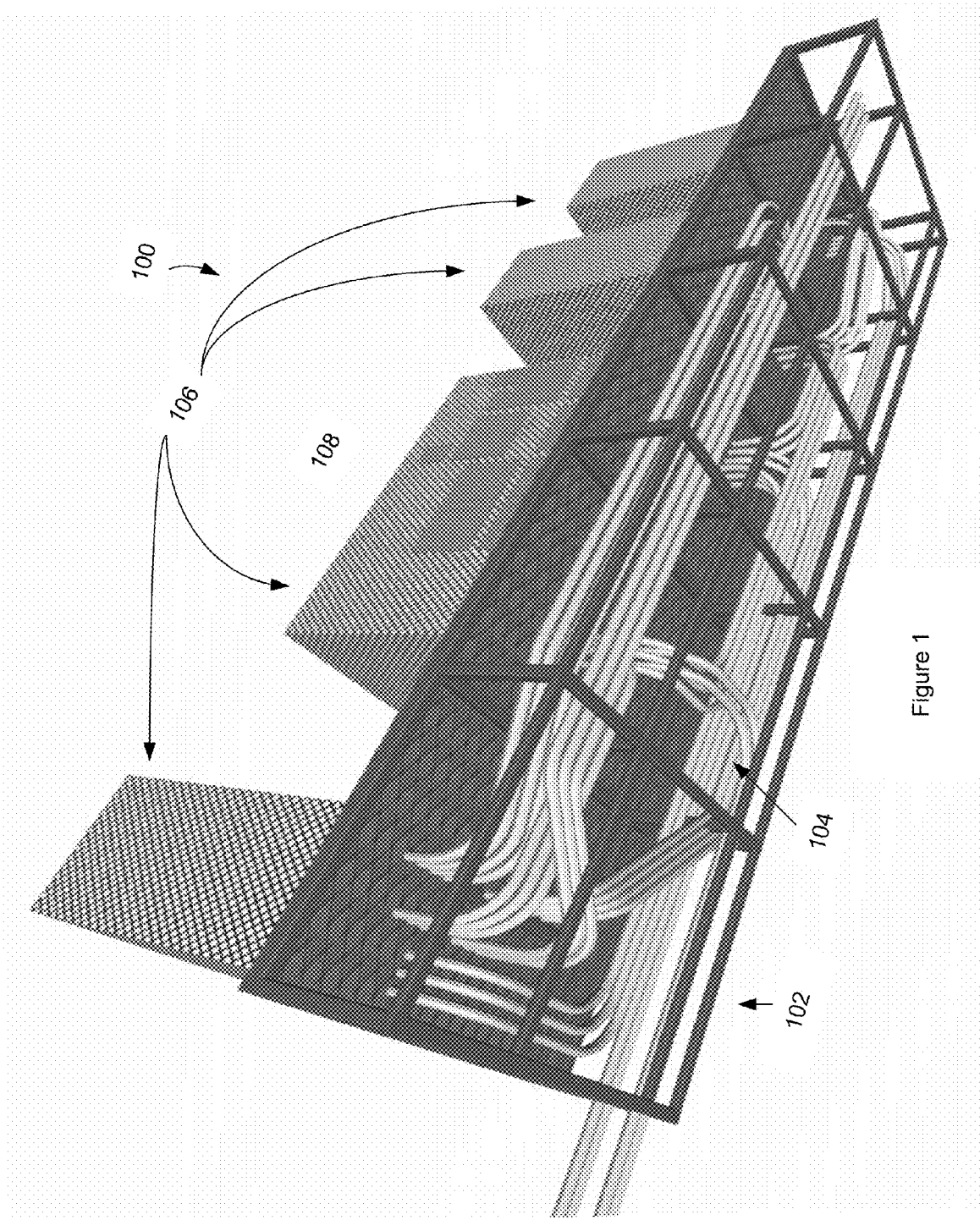
FIG. 1 illustrates an underneath view of an embodiment of the cabling routed along the framework of the skid going to the mounted cabinets.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, amount of emergency power supplies, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first enclosure, may be made. However, the specific numeric reference should not be interpreted as a literal sequential order but rather interpreted that the first enclosure is different than a second enclosure. Thus, the specific details set forth are merely exemplary. The specific details may be varied from and still be contemplated to be within the spirit and scope of the present invention.

In general, pre-wired and pre-engineered integrated platform for a set of two or more uninterruptable power supplies and power distribution that is pre-assembled, scalable, and modular is described. A set of cables having wiring is routed along a skeletal framework of the integrated platform. Equipment is supported on the skeletal framework of the integrated platform. Two or more cabinet enclosures are mounted onto the skeletal framework. The skeletal framework acts as a National Electric Code approved raceway system to support and route the set of cables to electrical equipment in the mounted cabinet enclosures. The weight of one or more cabinet enclosures mounted onto the skeletal framework is supported by the skeletal framework. A main power supply is housed in a first cabinet enclosure mounted to the skeletal framework. A backup power supply is housed in a second cabinet enclosure mounted to the skeletal framework. A power distribution center is housed in a third cabinet enclosure mounted to the skeletal framework. The main and redundant power supply wiring is laid out and routed along the skeletal framework of the integrated platform to and between the one or more enclosure mounted onto the skeletal framework.

The skeletal framework of the integrated platform has top and bottom rails run substantially parallel to each other with cross bars connecting the top and bottom rails to form the skeletal framework of the integrated platform. The skeletal framework has a top horizontal surface to which one or more of the cabinet enclosures mount to those rails making up the top horizontal surface of the skeletal framework. The wiring is routed along the frame in a vertical space between the bottom horizontal surface of the skeletal frame and the top horizontal surface of the skeletal frame. The set of cables, the skeletal framework, and the cabinet enclosures are fabricated in place prior to the integrated platform being installed, and are installed as a monolithic pre-wired pre-assembled integrated platform.

FIG. 1 illustrates an underneath view of an embodiment of the cabling routed along the framework of the skid going to the mounted cabinets. The pre-wired and pre-engineered integrated platform 100 for power supply and distribution is pre-assembled, scalable, and modular. The skeletal framework 102 of the integrated platform 100 acts as the equipment support structure as well as a cable routing support system rather than a separate cable tray above or below the skeletal framework 102. The cables 104 are routed along the framework 102 of the integrated platform 100 going to the mounted cabinets 106. The skeletal framework 102 acts as a National Electric Code approved raceway system to support and route the cabling 102 to the electrical equipment in the mounted cabinets 106.

The entire pre-wired and pre-engineered integrated platform 100 is built offsite such as at a factory and then shipped to the construction site in which the pre-wired and pre-engineered integrated platform 100 will be housed. The installation time will be significantly decreased because the enclosures, cabling and frameworks are already assembled and the electricians will not have to wait for other construction workers to lay down a floor or ceiling to create a raceway in route to the cabling. The wiring 104, framework 102 and equipment in the mounted cabinets 106 are fabricated in place prior to the integrated platform 100 being installed and is installed as a monolithic pre-wired pre-assembled integrated platform.

Building and testing the wiring 104, framework 102 and equipment in the mounted cabinets 106 may be cost effectively achieved in a controlled environment of a centralized factory or other build facilities. Such factory building and testing reduces the cost and time associated with conventional installation at a collocation site with site-specific requirements and constraints that would also otherwise involve costly skilled tradesmen, particularly to complete the build-out of power, network wiring, and/or cooling systems. The data center components may also enjoy the cost savings associated with mass assembly. Fully building and testing the data center components on the factory assembly floor also helps to reduce costly design and/or installation errors and helps to exploit economies of scale.

A data center can occupy one room of a building, one or more floors, or an entire building. Most of the equipment is often in the form of servers mounted in cabinets, which are usually placed in single rows forming corridors between them. This allows people access to the front and rear of each cabinet. The data center can be an example of an electrical load that needs to have power loss to that equipment virtually eliminated.

The integrated platform supports one or more enclosures 106 mounted onto the skeletal framework 102 of the integrated platform 100, where a first enclosure 108 houses at least a set of two or more uninterruptable power supplies designed to provide primary and backup uninterruptible power.

Figure 2:
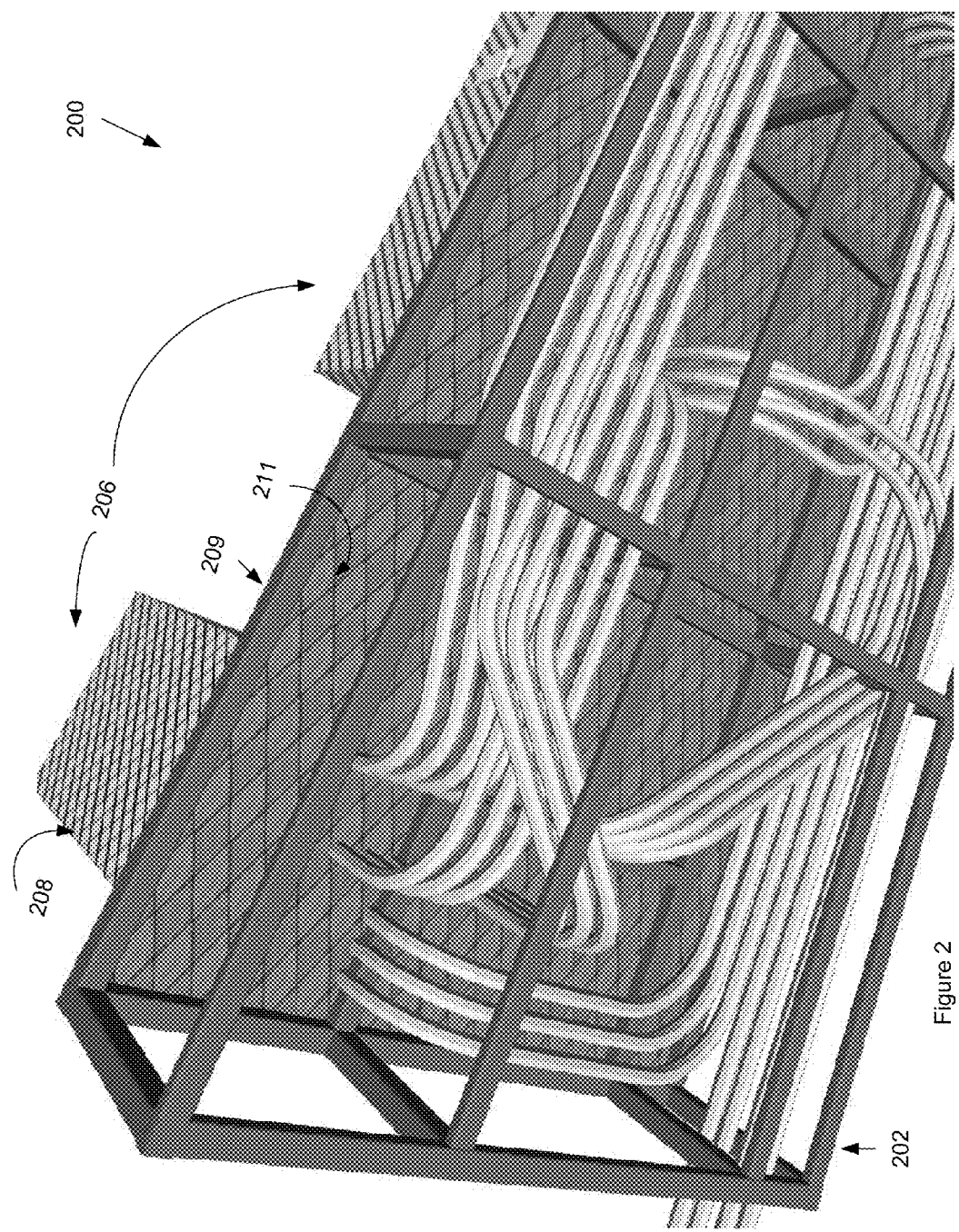
FIG. 2 illustrates an expanded view of an embodiment of the cabling routed along the framework of the skid going to the mounted cabinets.

FIG. 2 illustrates an expanded view of an embodiment of the cabling routed along the framework of the skid going to the mounted cabinets. The frame or cabinet enclosures 206 for mounting to the skeletal framework 202 may be fastened and torqued to the topside of the top horizontal surface 209 of the framework as well as to the underneath side 211 of the top horizontal surface 209 of the framework. The spacing between the rails of the skeletal framework 202 is set to have the enclosures span across rails and match up at the points where the enclosures, such as a first cabinet enclosure 208, fastens to the top horizontal surface 209 and underneath side 211 of the rails of the framework 202.

Thus, the skeletal framework 202 of the integrated platform 200 has top and bottom rails run substantially parallel to each other with cross bars connecting the top and bottom rails to form the skeletal framework 202 of the integrated platform 200. The skeletal framework 202 has a top horizontal surface 209 to which one or more of the enclosures mount 206, 208 to those rails making up the top horizontal surface of the skeletal framework 200.

Figure 3:
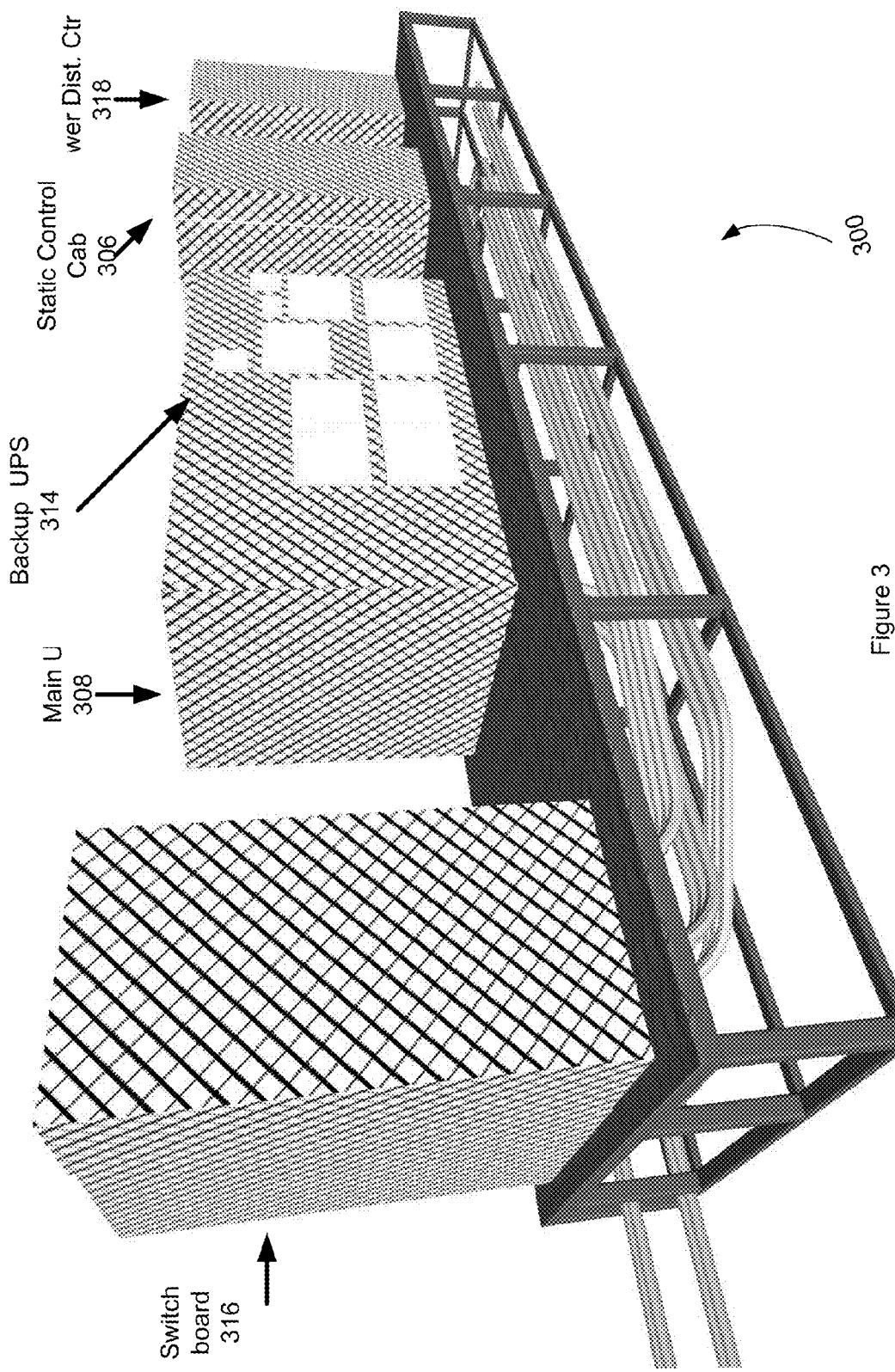
FIG. 3 illustrates a slightly raised side view of an embodiment of the wire cabling routed along the framework of the skid going to the mounted cabinets.

FIG. 3 illustrates a slightly raised side view of an embodiment of the wire cabling routed along the framework of the skid going to the mounted cabinets.

A three phase continuous duty, on-line, solid state Uninterruptible Power System (UPS) is integrated on the platform 300. The UPS integrated platform 300 operates in conjunction with the existing building electrical system to provide precisely controlled power for critical equipment loads. The system of mounted cabinets on the framework may consist of a system Static Switch Cabinet (SSC) 306, electrically parallel connected main UPS 308 and backup UPS 314 modules housed in a cabinet enclosure and sized in electrical power capacity to support the total load or the total load plus a specified number of redundant modules for enhanced reliability, a main UPS switch board 316, and a UPS output distribution board 318.

To prevent single points of failure, all elements of the electrical systems, including backup system, is fully duplicated, and critical electrical components such as servers are connected to both the main UPS 308 and backup UPS 314 power feeds via the UPS output distribution board 318. This arrangement is often made to achieve N+1 Redundancy in the systems. The Static switch cabinet 306 mounted to the skeletal framework contains the electrical equipment to ensure instantaneous switchover from one UPS supply.

Thus, the integrated platform 300 houses a set of uninterruptable power supplies 308, 314 designed to provide standby and interruptible power to components connecting to the UPS main distribution output board 318 of the integrated platform 300. The integrated platform supports one or more enclosures 306, 308, 314, 316, 318 mounted onto the skeletal framework 302 of the integrated platform 300. The main uninterruptable power supply may be housed in a first cabinet enclosure 308 mounted to the skeletal framework 302. The backup uninterruptable power supply may be housed in a second cabinet enclosure 314 mounted to the skeletal framework 302. The main and redundant power supply cabling is laid out and routed along the skeletal framework 302 of the integrated platform 300 to and from these uninterruptable power supplies. The main and redundant power supply wiring is laid out and routed along the skeletal framework 302 of the integrated platform 300 to and between the one or more enclosures 306, 308, 314, 316, 318 mounted onto the skeletal framework 302.

The wire cabling 304 is routed along the skeletal framework 302 in a vertical space between the bottom horizontal surface of the skeletal framework 302 and the top horizontal surface of the skeletal framework 302.

In an embodiment, the main UPS enclosure 308 and backup UPS enclosure 314 have wire cabling 304 routed along the rails of the skeletal frame to the cabinet enclosure mounted to the frame that houses the UPS main switch board 316. The UPS main switch board 316 has one or more electrical connections to the power cables of a backup AC power generator, one or more electrical connections to the signal controls to the backup AC diesel power generator to start up the diesel in an emergency and monitor its status, one or more electrical connections to the power cables of a main AC power generator, including a step down transformer connected to the power lines of the Electrical Power Grid. The UPS main switch board 316 also has one or more switches, including a first switch to select either the main or backup AC power source to supply power to both the main and backup UPS 308, 314 and a second switch. The second switch when activated isolates the main and backup UPS 308, 314 to allow the main UPS 308 to receive AC power from only the main or backup AC power source and similarly isolates the backup UPS 314 to receive AC power from only the main or backup AC power source. Cabling may also be routed in the framework to network interconnections coupling the UPS switchboard 316 to a network.

The main UPS enclosure 308 and backup UPS enclosure 314 may have wire cabling routed along the rails of the skeletal framework 302 to a cabinet enclosure mounted to the frame that houses the system control cabinet 306. The system control cabinet 306 may contain the system static switch and bypass control circuitry. The system control cabinet 306 contains a first and a second electrically parallel breaker to connect to the main UPS 308 via the first breaker to the UPS main distribution output board 318 and to connect to the backup UPS 314 via a second breaker to the UPS main distribution output board 318. The system control cabinet 306 also contains a third electrical path electrically in parallel with the first and second UPS breakers and the third electrical path is routed in wires along the rails of the skeletal frame 302 directly to a cabinet enclosure mounted to the skeletal framework 302 that houses the UPS main distribution output board 318. This third electrically parallel path with a third breaker allows selection of the external AC power source directly to the UPS main distribution output board 318 and thus bypassing the UPS's while still supplying AC power. This third switch and breaker thus provides power from either the main or backup AC power source even when both UPS's no longer provide power. Note, the wire cabling routed along the rails of the skeletal framework 302 is periodically secured to that framework via U-clamps, tie-wraps, and other National Electric Code approved securing mechanisms.

The main UPS enclosure 308 and backup UPS enclosure 314 may have wire cabling routed along the rails of the skeletal framework 302 directly to a cabinet enclosure mounted to the skeletal framework 302 that houses the UPS main distribution output board 318 that powers electrical equipment loads, such as servers, chillers, etc. with redundant UPS power.

The main UPS enclosure 308 and backup UPS enclosure 314 may have wire cabling routed along the rails of the skeletal framework 302 to a cabinet enclosure mounted to the framework 302 that houses an emergency power source including a battery.

The system may also consist of a solid-state inverter, rectifier/battery charger, a storage battery, a static bypass transfer switch, parallel control circuitry, synchronization control circuitry, connection control circuitry, disconnection control circuitry, system metering, system status indicators, system alarm annunciation circuitry, and accessories as specified herein.

The UPS integrated platform 300 can meet the requirements of the following standards: UL listed under 1778, Standards for Uninterruptible Power Supply Equipment; UL Canada (cUL); and FCC rules and regulations of Part 15, subpart J, class A. Each UPS may include one or more in-line filters and power switching apparatus coupled to the power distribution interconnections; an AC/DC converter coupled to the power distribution interconnections that is powered using a trickle charge; and a battery storage coupled to a DC output of the AC/DC converter.

Figure 4:
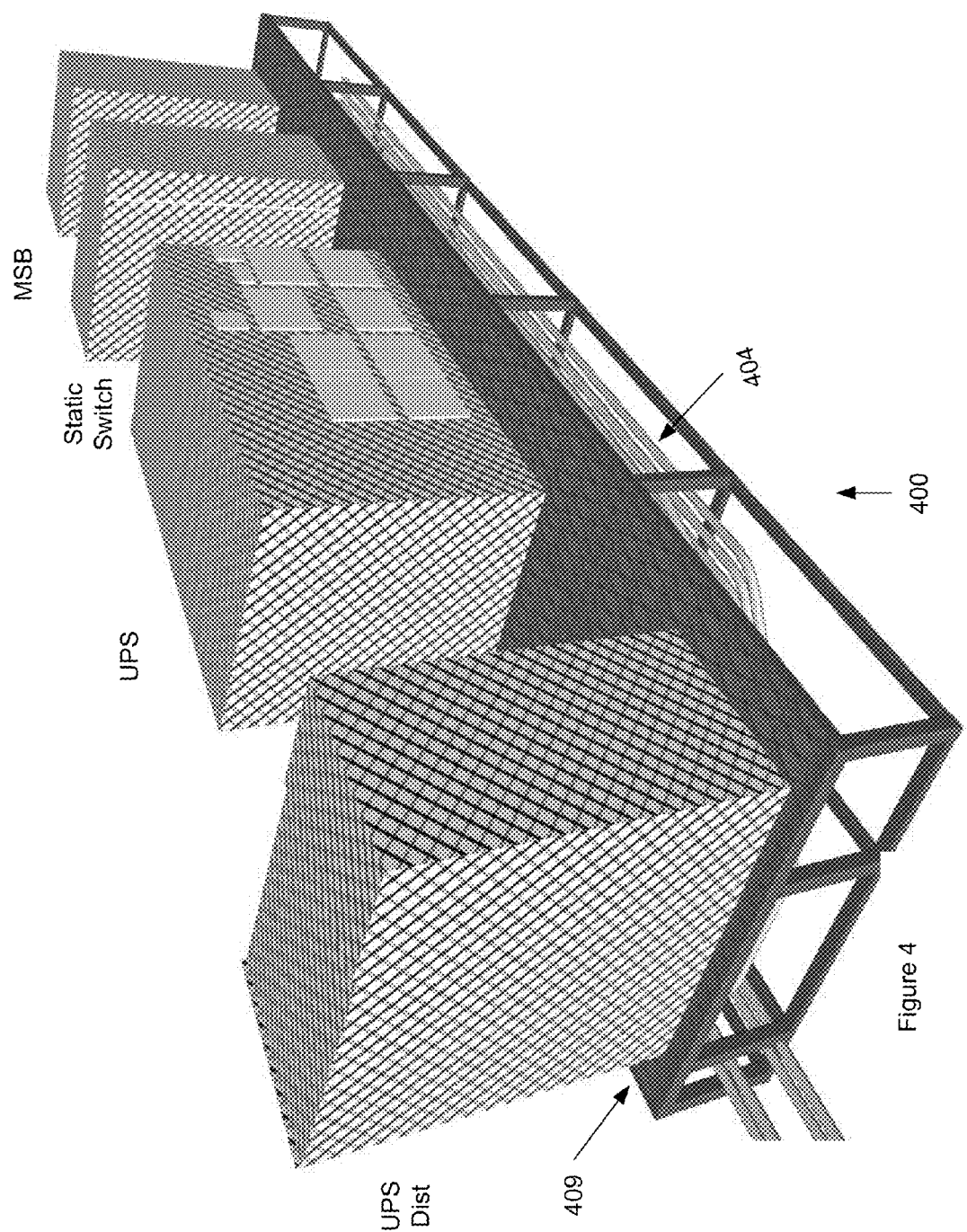
FIG. 4 illustrates a slightly raised top down view of an embodiment of the wire cabling routed along the framework of the skid going to the mounted cabinets.

FIG. 4 illustrates a slightly raised top down view of an embodiment of the wire cabling routed along the framework of the skid going to the mounted cabinets.

The weight of the integrated platform 400 including the mounted cabinet enclosures and the skeletal framework is heavy enough by itself to be structurally sound and not required to be anchored to a construction foundation or to a building's foundation in non-seismic zones. Each cabinet enclosure mounted to the framework when fully loaded with its electrical equipment may weigh several thousand pounds by itself.

Data centers typically have raised flooring removable square tiles. The trend is towards having a large void to cater for better and uniform air distribution. These provide a plenum for air to circulate below the floor, as part of the air conditioning. Data cabling is typically routed through overhead cable trays in modern data centers. The integrated platform 400 is engineered to provide both a wide and open enough plenum to provide air to circulate through for air conditioning and a cable routing structure.

The top horizontal surface 409 of the skeletal framework of the integrated platform may be at the floor level of a building with the cabling 404 routed along the rails of the framework being able to maintain an above-ground open-air current capacity rating due to the framework and cabling 404 not being buried in earth or concrete.

In most cases, the integrated platform 400 due to its own weight will need not be secured to the floor or adjacent building structure so as to not fall over. However, securing to the floor or building may be required by code in seismic zones.

Figure 5:
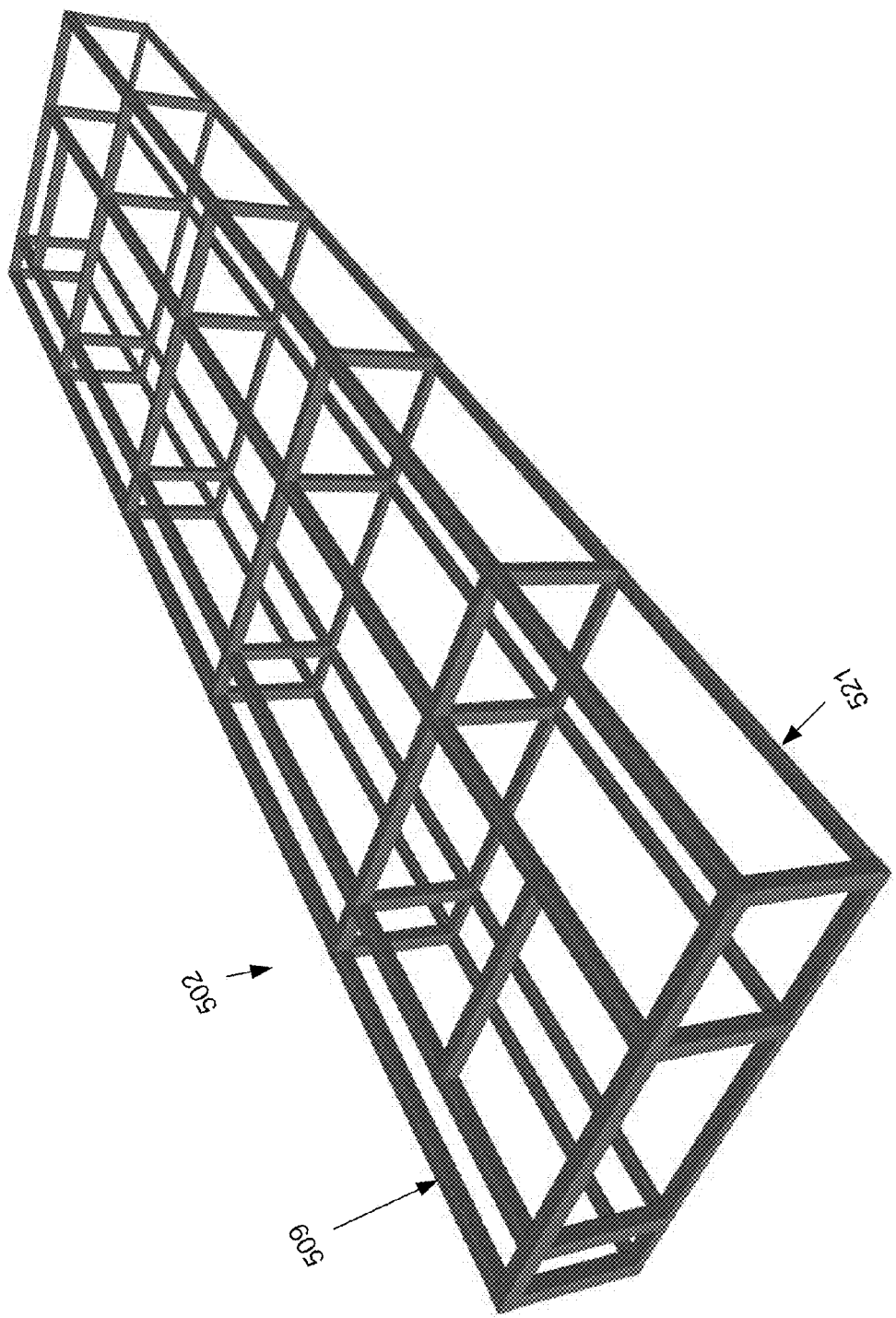
FIG. 5 illustrates a slightly raised side view of an embodiment of the framework of the skid that mounts the cabinets and acts as a National Electric Code approved raceway system to support and route the cabling to the electrical equipment in the cabinets.

FIG. 5 illustrates a slightly raised side view of an embodiment of the framework of the skid that mounts the cabinets and acts as a National Electric Code approved raceway system to support and route the cabling to the electrical equipment in the cabinets.

The skeletal framework 502 has a top horizontal surface 509 to which one or more of the enclosures mount to those rails making up the top horizontal surface 509 of the skeletal framework 502. The wire cabling is routed along the rails of the framework 502 in a vertical space between the bottom horizontal surface 521 of the skeletal frame and the top horizontal surface 509 of the skeletal frame.

The frame or enclosures for mounting to the frame may be fastened and torqued to the frame with screws threading through a thread hole in the framework.

The rails are each an example 1-2 inches wide, and are separated by a gap to provide mounting areas for the cabinet enclosures to mount to as well as running the rails close enough to give structural support to the entire integrated platform structure when put in place by a crane at the construction site. The top rails may have holes in them at regular intervals to allow for easier mounting and fastening.

The mounting holes may be tapped to receive a particular type of threaded bolt. The round holes may also be large enough to permit a bolt to be freely inserted through without binding, and bolts are fastened in place using cage nuts.

The rails are usually made of metal such as steel of around 10 mm thickness or of slightly thicker aluminum.

The equipment enclosures are attached at all four corners directly onto the frame.

Figure 6:
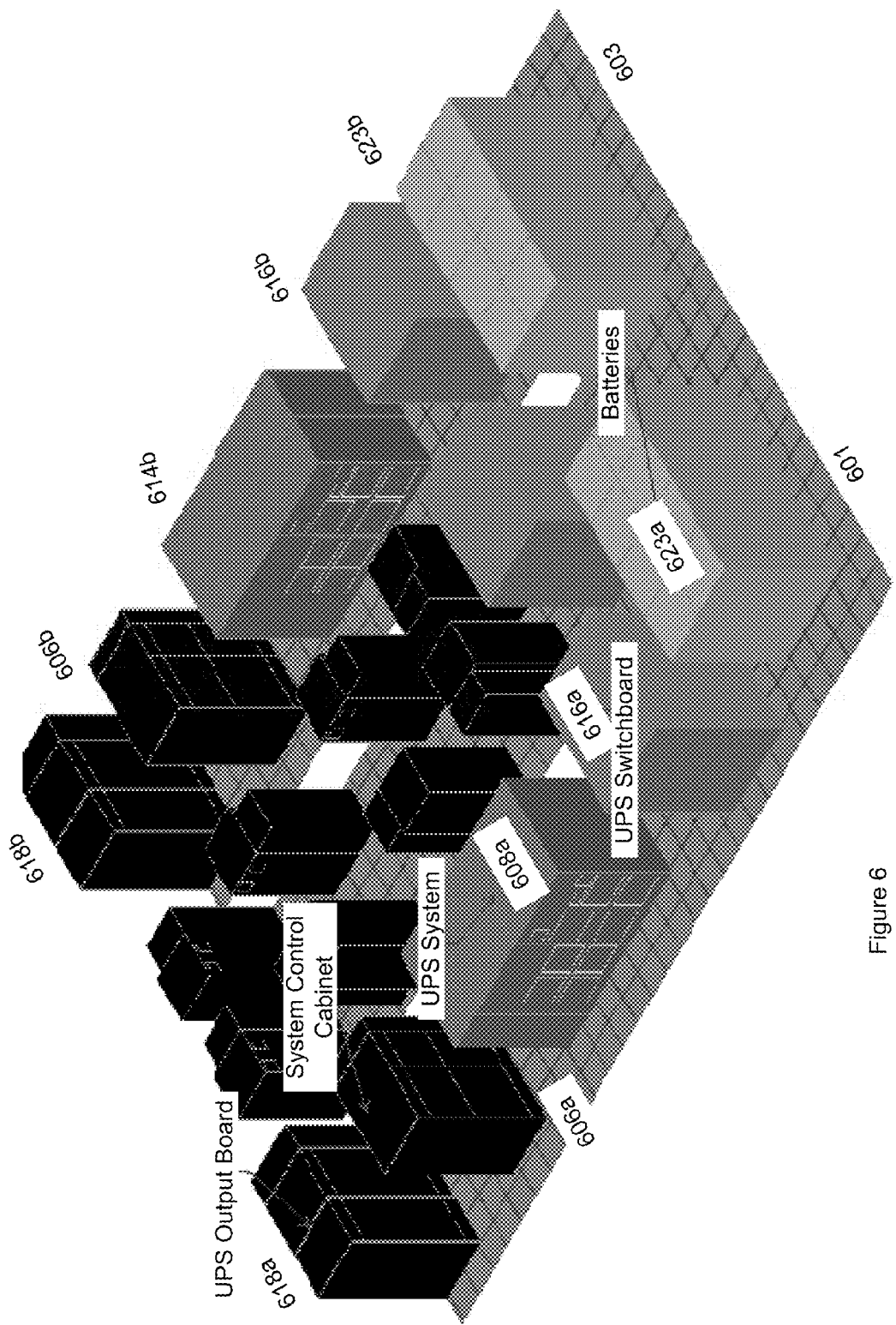
FIG. 6 illustrates a top perspective view of an embodiment of the pre-wired and pre-engineered integrated platform for a modular power supply and distribution system.

FIG. 6 illustrates a top perspective view of an embodiment of the pre-wired and pre-engineered integrated platform for a modular power supply and distribution system. As discussed, the pre-wired and pre-engineered integrated platform for power supply and distribution 600 is pre-assembled, scalable, and modular. The pieces of equipment at least include a fully functional modular power distribution assembly.

Two or more pre-wired and pre-engineered integrated platforms for power supply and distribution may be scaled and combined to power greater loads. Thus, a first integrated platform 601 has one or more electrical connections to couple with a second integrated platform 603 and one or more fastening connections in the framework to modularly combine with the second integrated platform 603 to supply a greater amount of electrical power. The two integrated platforms 601 603 each have a compliment of UPS cabinets, 606a-618a and 606b-618b respectively, and then combine to power a greater load than just one skid. Each integrated platform 601 603 may have its own backup AC source or share a common backup AC generator as well as have their own emergency power source, such as a first battery 623a and a second battery 623b, or share a common emergency power source.

The main UPS 608a/b and backup UPS 614a/b enclosures have wiring routed along the rails of the skeletal framework to a cabinet enclosure mounted to the framework that houses an emergency power source 623a/b. The emergency power source 623a/b could include a battery, including solar powered and chemical based batteries, or a kinetic (fly wheel) energy source.

The integrated platform 600 can be deployed as a tested assembly. Each equipment component potentially from distinct manufactures has had its interoperability with the other pieces of equipment on the integrated platform tested and verified prior to deployment onsite.

The integrated platform 600 is configured so it can ship easily, be factory built and deployed at data center sites. The integrated platform 600 may mount rack or shelf mount enclosures.

Installation at each site may be customized to take into account site-specific constraints, i.e., site-to-site variations in floor depth, width, etc.

The backup power consists of one or more uninterruptible power supplies 308a/b, 314a/b, diesel generators, and/or emergency batteries 623a/b.

FIG. 7 illustrates a one line electrical schematic of an embodiment of the pre-wired and pre-engineered integrated platform for a modular power supply and distribution system.

The pre-wired and pre-engineered integrated platform for a modular power supply and distribution system includes: a main and a backup uninterruptable power supply 708, 714, a UPS switch board 716, and a system control cabinet 706.

The UPS switch board 716 may have power connections to a backup AC power generator 729, one or more electrical connections to the signal controls of the backup AC diesel power generator to start up the diesel in an emergency and monitor its status, one or more electrical connections to the power cables of a main AC power generator including a step down transformer 731 connected to the power lines of the Electrical Power Grid, as well as one or more switches such as a programmable logic controller PLC. The switches select either the main or backup AC power source to supply power to both the main and backup UPS, can isolate the main and backup UPS to allow the main UPS to receive AC power from only the main or backup AC power source and isolate the backup UPS to receive AC power from only the main or backup AC power source. The UPS switchboard 716 may have an electrical connection to receive 480 Volts AC from the external AC power source of the step down transformer or diesel generator.

The system control cabinet 706 contains a first and a second electrically parallel breaker to connect to the main UPS via the first breaker and to connect to the backup UPS via a second breaker. The system control cabinet 706 also contains a third electrical path electrically in parallel with the first and second UPS breakers and the third electrical path is routed in wires along the rails of the skeletal frame to a cabinet enclosure mounted to the frame that houses a UPS switchboard to allow bypassing the UPS's while still supplying AC power from the external AC source.

The main AC distribution outlet board 718 that powers equipment such as servers, chillers, etc. with redundant UPS power. Equipment for high power consumption but critically needing redundant power such as a portable data center built into a standard shipping container may be one of the electrical loads that connects to the main AC distribution outlet board 718.

FIGS. 8a and 8b illustrate an embodiment of the System Control Cabinet. FIG. 8a illustrates a front view of the System Control Cabinet 800. FIG. 8b illustrates a side view of the System Control Cabinet 800.

While some specific embodiments of the invention have been shown, the invention is not to be limited to these embodiments. For example, most functions performed by electronic hardware components may be duplicated by software emulation. Thus, a software program written to accomplish those same functions may emulate the functionality of the hardware components in input-output circuitry. The type of cabinets may vary, etc. The invention is to be understood as not limited by the specific embodiments described herein, but only by scope of the appended claims.

We claim:

1. A pre-wired and pre-engineered integrated platform for a power supply and distribution skid that is pre-assembled, scalable, and modular, comprising:
a skeletal framework of the integrated platform that acts as an equipment support structure as well as a cable routing support system;
a set of cables having wiring routed along the skeletal framework of the integrated platform going to two or more cabinet enclosures mounted onto the skeletal framework, where the skeletal framework acts as a National Electric Code approved raceway system to support and route the set of cables to electrical equipment in the mounted cabinet enclosures;
wherein the integrated platform supports the weight of two or more cabinet enclosures mounted onto the skeletal framework that includes a main power supply housed in a first cabinet enclosure mounted to the skeletal framework, a backup power supply housed in a second cabinet enclosure mounted to the skeletal framework, and a power distribution center housed in a third cabinet enclosure mounted to the skeletal framework, where main and redundant power supply wiring is laid out and routed along the skeletal framework of the integrated platform to and between the two or more enclosures mounted onto the skeletal framework, wherein the skeletal framework of the integrated platform has top and bottom longitudinal rails that run substantially parallel to each other with cross bars connecting the top and bottom rails, and lateral rails that connect to the longitudinal rails to form the skeletal framework of the integrated platform, the skeletal framework has a top horizontal surface to which two or more of the cabinet enclosures mount to the longitudinal and the lateral rails making up the top horizontal surface of the skeletal framework, wherein the wiring is routed along the skeletal framework in a vertical space between a bottom horizontal surface of the skeletal framework and the top horizontal surface of the skeletal framework, wherein the set of cables, the skeletal framework and the cabinet enclosures are fabricated in place prior to the integrated platform being installed and are installed as a monolithic pre-wired preassembled integrated platform.

2. The integrated platform of claim 1, where the integrated platform is deployed as a tested assembly, wherein at least two or more equipment components in the one or more cabinet enclosures mounted onto the skeletal framework potentially come from distinct manufactures and these equipment components have had their interoperability with the other pieces of equipment on the integrated platform tested and verified prior to deployment onsite and the wire cabling routed along the rails of the skeletal framework is periodically secured to that framework.

3. The integrated platform of claim 1, wherein the first cabinet enclosure is fastened and torqued to a topside of the top horizontal surface of the framework as well as to an underneath side of the top horizontal surface of the framework, and a spacing between the rails of the skeletal framework is set to have the cabinet enclosures span across the rails and match up at points where the enclosures fasten to the top horizontal surface of the framework.

4. The integrated platform of claim 1, wherein the weight of the integrated platform including the mounted cabinet enclosures and the skeletal framework is heavy enough by itself to be structurally sound and not require to be anchored to either a construction foundation or to a building's foundation in non-seismic zones.

5. The integrated platform of claim 1, where two or more of the pre-wired and pre-engineered integrated platforms for the power supply and distribution skid are scaled and combined to supply electricity to a greater amount of power loads, a first integrated platform has one or more electrical connections to couple with a second integrated platform and two or more fastening connections in the framework to modularly combine with the second integrated platform to supply the greater amount of electrical power.

6. The integrated platform of claim 1, wherein the top horizontal surface of the skeletal frame of the integrated platform is at a floor level of a building with the wiring routed anywhere along the skeletal framework and being able to maintain an above ground open air current capacity rating due to the framework and cabling not being buried in earth or concrete, and the bottom horizontal surface of the skeletal frame is below the floor level of the building.

7. The integrated platform of claim 1, wherein the rails of the skeletal framework are separated by a gap close enough to provide mounting areas for the cabinet enclosures to mount to as well as close enough to give structural support to the entire integrated platform structure when put in place by a crane at a construction site, and two or more of the rails have holes in them at regular intervals to allow for easier mounting and fastening.

8. The integrated platform of claim 1, further comprising a static switch cabinet mounted to the skeletal framework, wherein the main power supply housed in the first cabinet enclosure is a main uninterruptible power supply (UPS), the backup power supply housed in the second cabinet enclosure is a backup uninterruptible power supply, and the main and backup UPS are electrically connected in parallel and the static switch cabinet contains electrical equipment to ensure instantaneous switchover from one UPS supply to the other in the event of a power failure as well as provide a bypass switch for power when both the main UPS and the backup UPS are not available.

9. The integrated platform of claim 1, further comprising:
a fourth cabinet enclosure mounted to the skeletal frame that houses a system control cabinet that contains a system static switch and bypass control circuitry;
wherein the main power supply housed in the first cabinet enclosure is a main UPS, the backup power supply housed in the second cabinet enclosure is a backup UPS, and the main UPS enclosure and backup UPS enclosure have wire cabling routed along the rails of the skeletal framework to the system control cabinet,
wherein the bypass control circuitry in the system control cabinet contains a first and a second electrically parallel breakers to connect to the main UPS via the first breaker to the power distribution center and to connect to the backup UPS via the second breaker to the power distribution center, and the bypass control circuitry also contains a third electrical path electrically in parallel with the first and second UPS breakers, and the third electrical path is routed in wires along the rails of the skeletal frame directly to the third cabinet enclosure mounted to the skeletal framework that houses the power distribution center, where this third electrically parallel path with a third breaker allows selection of the external AC power source directly to the power distribution center and thus bypassing the main and backup UPS's while still supplying AC power to the power distribution center.

10. The integrated platform of claim 8, wherein the main UPS and backup UPS enclosures have wiring routed along the rails of the skeletal framework to a fourth cabinet enclosure mounted to the framework that houses an emergency power source of at least one of the following 1) a battery powered by solar or chemical energy, or 2) a kinetic energy source.

11. The integrated platform of claim 8, wherein the main UPS enclosure and backup UPS enclosure have their wiring routed along the rails of the skeletal frame to a fourth cabinet enclosure mounted to the frame that houses a UPS main switch board, and the UPS main switch board has one or more electrical connections to the power cables of a backup AC power generator, one or more electrical connections to the signal controls to the backup AC power generator to start up the AC generator in an emergency and monitor its status, and one or more electrical connections to the power cables of a main AC power generator including a step down transformer connected to the power lines of an Electrical Power Grid.

12. The integrated platform of claim 9, wherein the main UPS and backup UPS enclosures have wiring routed along the rails of the skeletal frame to an emergency power source of at least one of the following 1) a battery powered by solar or chemical energy, or 2) a kinetic energy source, and the power distribution center has an electrical connection to receive 480 Volts AC from an external AC power source.

13. The integrated platform of claim 9, wherein the cabinet enclosures for mounting to the frame are fastened and torqued to the frame with a nut and a bolt through a hole in the framework.

14. The integrated platform of claim 11, wherein the UPS main switch board further comprises:
one or more switches, including
a first switch to select either a main AC power source or the backup AC power source to supply electrical power to both the main and backup UPS,
a second switch when activated isolates the main and the backup UPS to allow the main UPS to receive AC power from only the main or the backup AC power source and similarly isolates the backup UPS to receive the AC power from only the main or back up AC power source;
and cabling routed along the framework from the fourth cabinet enclosure to network interconnections coupling the UPS switchboard to a building's local or wide area network.

15. A method of fabricating an integrated platform, comprising:
pre-wiring, pre-engineering and assembling the integrated platform for power supply and distribution;
routing a set of cables having wiring along a skeletal framework of the integrated platform;
supporting equipment on the skeletal framework of the integrated platform;
mounting two or more cabinet enclosures onto the skeletal framework, where the skeletal framework acts as a National Electric Code approved raceway system to support and route the set of cables to electrical equipment in the mounted cabinet enclosures; and
supporting the weight of the two or more cabinet enclosures mounted onto the skeletal framework, where a main power supply is housed in a first cabinet enclosure mounted to the skeletal framework, a backup power supply is housed in a second cabinet enclosure mounted to the skeletal framework, and a power distribution center is housed in a third cabinet enclosure mounted to the skeletal framework, where main and redundant power supply wiring is laid out and routed along the skeletal framework of the integrated platform to and between the two or more enclosures mounted onto the skeletal framework, wherein the skeletal framework of the integrated platform has top and bottom longitudinal rails run substantially parallel to each other with cross bars connecting the top and bottom rails, and lateral rails connecting to the longitudinal rails to form the skeletal framework of the integrated platform, the skeletal framework has a top horizontal surface to which one or more of the cabinet enclosures mount to the longitudinal and lateral rails making up the top horizontal surface of the skeletal framework, wherein the wiring is routed along the skeletal framework in a vertical space between a bottom horizontal surface of the skeletal framework and the top horizontal surface of the skeletal framework, wherein the set of cables, the skeletal framework and the cabinet enclosures are fabricated in place prior to the integrated platform being installed and are installed as a monolithic pre-wired preassembled integrated platform.

16. The method of claim 15, further comprising:
testing the equipment components in the one or more cabinet enclosures mounted onto the skeletal framework before the integrated platform is installed, wherein at least two or more potentially come from distinct manufactures and these equipment components have had their interoperability with the other pieces of equipment on the integrated platform tested and verified.

17. The method of claim 15, further comprising:
mounting a fourth cabinet enclosure to the skeletal frame that houses a system control cabinet that contains a system static switch and bypass control circuitry;
wherein the main power supply housed in the first cabinet enclosure is a main UPS, the backup power supply housed in the second cabinet enclosure is a backup UPS, and the main UPS enclosure and backup UPS enclosure have the wiring routed along the rails of the skeletal framework to the system control cabinet,
wherein the bypass control circuitry in the system control cabinet contains a first and a second electrically parallel breakers to connect to the main UPS via the first breaker to the power distribution center and to connect to the backup UPS via the second breaker to the power distribution center, and the bypass control circuitry also contains a third electrical path electrically in parallel with the first and second UPS breakers, and the third electrical path is routed in the wiring along the rails of the skeletal frame directly to the third cabinet enclosure mounted to the skeletal framework that houses the power distribution center, where this third electrically parallel path with a third breaker allows selection of an external AC power source directly to the power distribution center and thus bypassing the main and the backup UPS's while still supplying AC power to the power distribution center.

18. The method of claim 15, further comprising
mounting a static switch cabinet mounted to the skeletal framework, wherein the main power supply housed in the first cabinet enclosure is a main uninterruptible power supply (UPS), the backup power supply housed in the second cabinet enclosure is a backup uninterruptible power supply, and the main and the backup UPS are electrically connected in parallel and the static switch cabinet contains electrical equipment to ensure instantaneous switchover from one UPS supply to the other in the event of a power failure as well as provide a bypass switch for power when both the main UPS and the backup UPS are not available.

19. The method of claim 16, further comprising:
placing holes in the rails at regular intervals to allow the first cabinet enclosure to fasten and torque to a topside of the top horizontal surface of the framework as well as to an underneath side of the top horizontal surface of the framework; and
spacing a gap between the rails of the skeletal framework to have the cabinet enclosures span across rails and match up at points where the enclosures fasten to the top horizontal surface of the framework.

20. The method of claim 19, further comprising:
making the weight of the integrated platform including the mounted cabinet enclosures and the skeletal framework heavy enough by itself to be structurally sound and not require to be anchored to either a construction foundation or to a building's foundation in non-seismic zones.

* * * * *